(12) United States Patent
Hsu

(10) Patent No.: US 9,748,161 B2
(45) Date of Patent: Aug. 29, 2017

(54) HEAT DISSIPATION DEVICE

(71) Applicant: Foxconn Technology Co., Ltd., New Taipei (TW)

(72) Inventor: Wei-Hang Hsu, New Taipei (TW)

(73) Assignee: Foxconn Technology Co., Ltd., New Taipei (TW)

( * ) Notice: Subject to any disclaimer, the term of this patent is extended or adjusted under 35 U.S.C. 154(b) by 140 days.

(21) Appl. No.: 14/698,404

(22) Filed: Apr. 28, 2015

(65) Prior Publication Data

US 2016/0227674 A1 Aug. 4, 2016

(30) Foreign Application Priority Data

Feb. 3, 2015 (TW) .............................. 104103631 A

(51) Int. Cl.
| | |
|---|---|
| F28F 7/00 | (2006.01) |
| H01L 23/34 | (2006.01) |
| H01L 23/367 | (2006.01) |
| H01L 23/40 | (2006.01) |
| F28D 21/00 | (2006.01) |

(52) U.S. Cl.
CPC ............ H01L 23/34 (2013.01); H01L 23/367 (2013.01); H01L 23/4006 (2013.01); *F28D 2021/0029* (2013.01); *H01L 2023/4056* (2013.01); *H01L 2023/4068* (2013.01)

(58) Field of Classification Search
CPC ... H01L 23/34; H01L 23/367; H01L 23/4006; H01L 23/40; H01L 23/46; H01L 23/467; H01L 2023/4068; H01L 2023/4056; F28D 2021/0028; F28D 2021/0029
See application file for complete search history.

(56) References Cited

U.S. PATENT DOCUMENTS

| | | | | | |
|---|---|---|---|---|---|
| 4,246,597 | A | * | 1/1981 | Cole | H01L 23/3675 165/185 |
| 4,448,240 | A | * | 5/1984 | Sharon | H01L 23/4338 165/185 |
| 4,483,389 | A | * | 11/1984 | Balderes | H01L 23/4338 165/80.3 |
| 4,770,242 | A | * | 9/1988 | Daikoku | H01L 23/4338 165/185 |
| RE35,721 | E | * | 2/1998 | Daikoku | H01L 23/4338 165/185 |
| 7,277,291 | B2 | * | 10/2007 | Ross | H01L 23/4338 165/104.33 |

(Continued)

*Primary Examiner* — Ryan J Walters
*Assistant Examiner* — Jon T Schermerhorn
(74) *Attorney, Agent, or Firm* — Steven Reiss

(57) ABSTRACT

A heat dissipation device includes a base, a fin assembly mounted on a top surface of the base, and a heat absorber arranged at a bottom surface of the base. The bottom surface of the base defines a recess corresponding to the heat absorber. The heat absorber is embedded in the recess. A fixing plate is positioned at the bottom surface of the base to cover the recess and define a sealed/airtight cavity between the fixing plate and the base. A top end of the heat absorber is received in the sealed/airtight cavity. A top end of the heat absorber extends through the fixing plate to expose out of the sealed/airtight cavity. A flexible sheet is totally received in the sealed/airtight cavity to buffer a stress generated by assembling the heat dissipation device with external elements.

8 Claims, 5 Drawing Sheets

(56) References Cited

U.S. PATENT DOCUMENTS

| | | | |
|---|---|---|---|
| 2013/0077248 A1* | 3/2013 | Lo .......................... | H01L 23/34 361/704 |
| 2014/0082824 A1* | 3/2014 | McDowell ........... | A41D 25/003 2/157 |
| 2015/0055299 A1* | 2/2015 | Arvelo .................... | H01L 23/34 361/699 |

* cited by examiner

HEAT DISSIPATION DEVICE

FIELD

The disclosure relates to heat dissipating fields, and more particularly to a heat dissipation device used for dissipating heat generated from electronic components in electronic devices.

BACKGROUND

With the continuing development of electronics technology, many electronic components are nowadays made in a small size but with a high operating frequency capability. For example, an electronic package such as a Central Processing Unit ("CPU"), when employed in electronic devices, may run at very high speeds and generate a lot of heat. A heat dissipation module is commonly installed in such an electronic device, in contact with the CPU for quickly dissipating the generated heat.

A typical heat dissipation device includes a base and a fin assembly mounted on the base. A bottom surface of the base is provided with a heat absorber for absorbing heat generated by the electronic component, and four corners of the base are attached to a circuit board with screws. However, because of the material differences between the metal base and the resin circuit board, the circuit board is prone to deformation and forms a gap between the base and the circuit when assembled, such that a stability of the heat dissipation device is decreased and a heat dissipation efficiency of the heat dissipation device is influenced.

BRIEF DESCRIPTION OF THE DRAWINGS

Implementations of the present technology will now be described, by way of example only, with reference to the attached figures.

DETAILED DESCRIPTION

Figure 1:
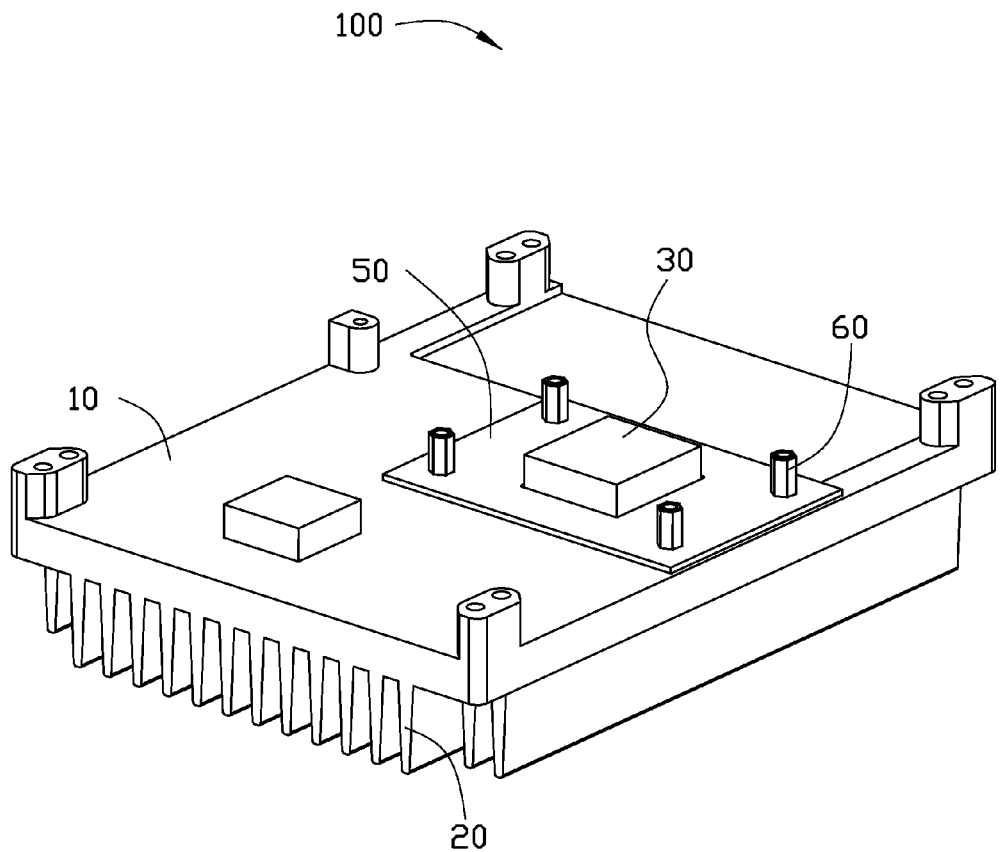
FIG. 1 is an assembled, isometric view of a heat dissipation device in accordance with an exemplary embodiment of the present disclosure.
Figure 2:
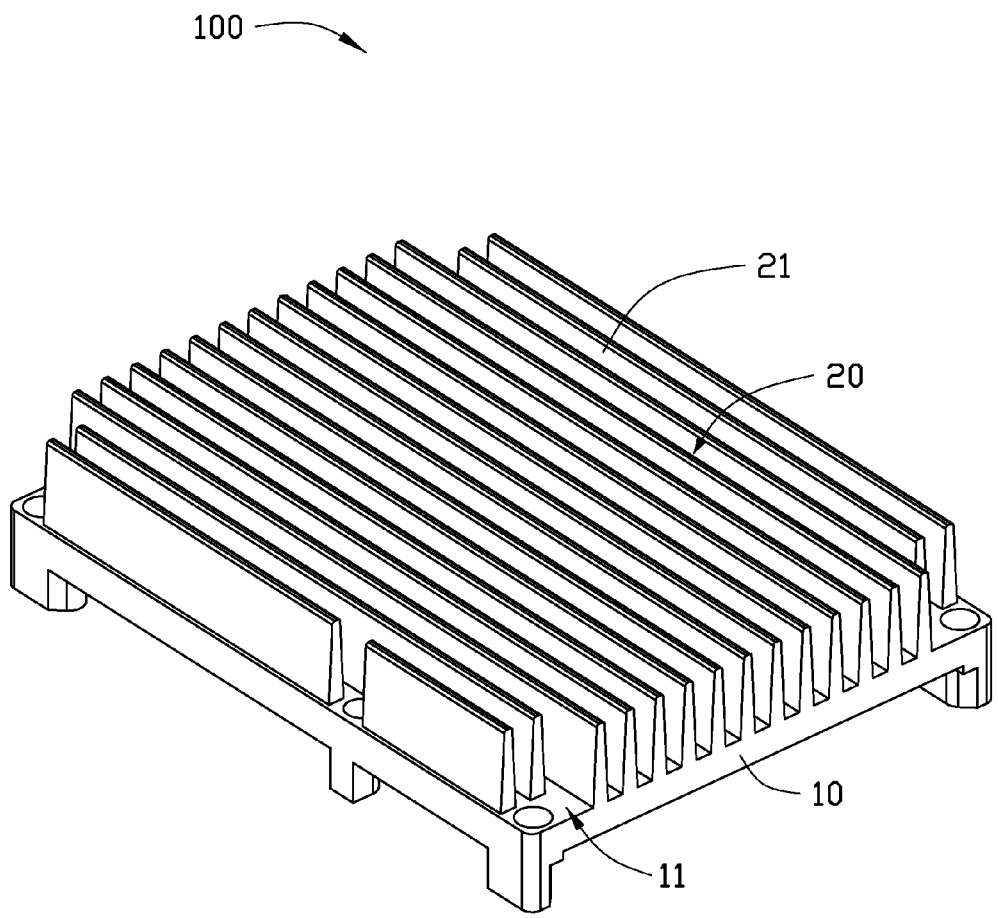
FIG. 2 is an another assembled view of the heat dissipation device of FIG. 1.
Figure 3:
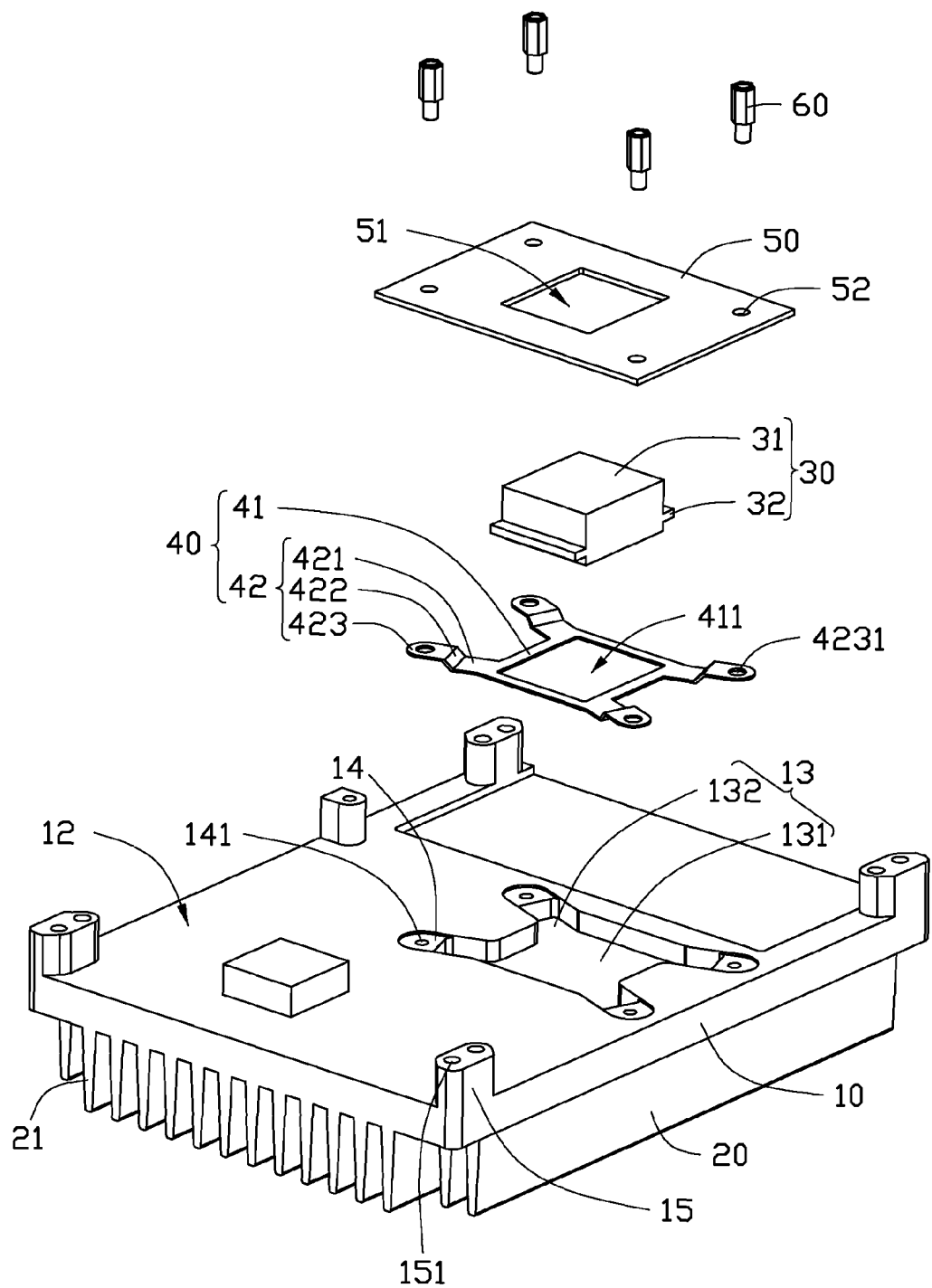
FIG. 3 is an exploded view of the heat dissipation device of FIG. 1.
Figure 4:
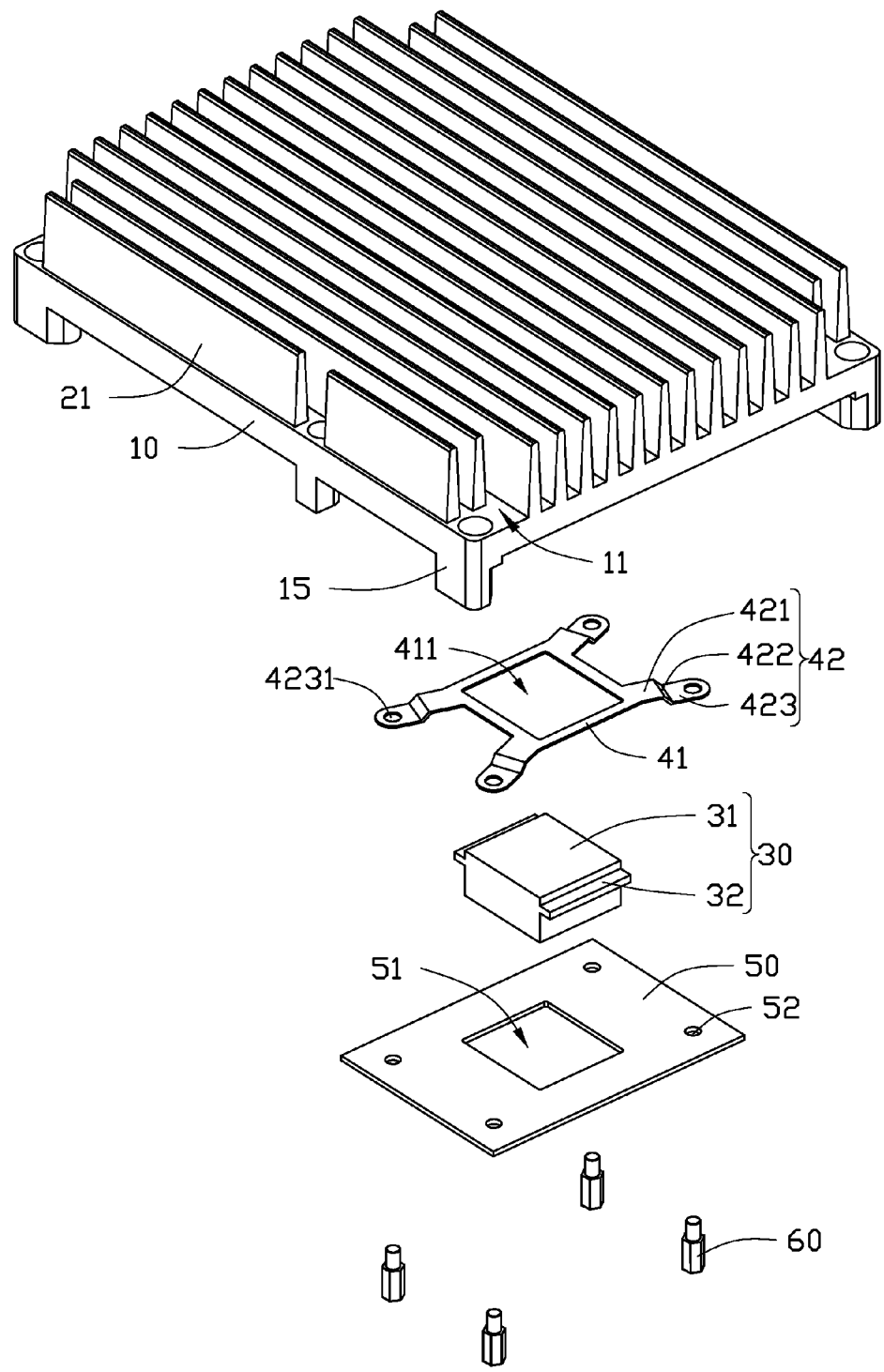
FIG. 4 is another exploded view of the heat dissipation device of FIG. 1.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented.

The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising," when utilized, means "including, but not necessarily limited to"; it specifically indicates open-ended inclusion or membership in the so-described combination, group, series and the like.

The present disclosure is described in relation to a heat dissipation device, and particularly to a heat dissipation device having base and a heat absorber attached thereto.

FIGS. 1 to 4 illustrate a heat dissipation device 100 in accordance with an exemplary embodiment of the present disclosure. The heat dissipation device 100 includes a base 10, a fin assembly 20, a heat absorber 30, a flexible sheet 40 and a fixing plate 50. The fin assembly 20 and the heat absorber 30 are respectively arranged two opposite sides of the base. The heat dissipation device 10 is mounted on a circuit board (not shown), the heat absorber 30 is configured to contact with the electrical component for conducting heat generated by the electrical component to the fin assembly 20.

Specifically, the base 10 is a rectangular and flat plate. The base includes a top surface 11 and a bottom surface 12 opposite to the top surface 11.

The base 10 defines a recess 13 at center of the bottom surface 12 along a direction toward the top surface. A depth of the recess 13 is smaller than a thickness of the base 10. The recess 13 includes a receiving portion 131 and a plurality of positioning portion 132 obliquely extending outward from the receiving portion. It is namely that each the positioning portion 132 is communicated with the receiving portion. Each the positioning portion 132 is strip shaped. In this embodiment, the receiving portion 131 has a rectangular configuration. There are four positioning portions 132. The four positioning portions 132 respectively extend outward from the four corners of the receiving portion 131. Each free end of the positioning portion 132 is provided with a step 14. The step 14 is located at a free end of the corresponding positioning portion 132. A thickness of the step 14 is slightly smaller than the depth of the recess 13. A length of the step 14 is smaller than a length of the positioning portion 132. Each step 14 defines a through hole 141 pronging the base 10. Each of the through holes 141 is provided with inner screw thread (not shown).

The base 10 further includes four blocks 15 corresponding located at four corners of bottom surface 12. Each of the blocks 15 defines a fixing hole 151 prong the block 15 and the base 10. In this embodiment, the base 10 is mounted to the circuit board by screwing the fixing hole 151 with screws.

The fin assembly 20 is arranged on the top surface 11 of the base 10. In this embodiment, the fin assembly 20 and the base 10 is integrally formed as a single piece by aluminum extrusion. Both the fin assembly 20 and the base 10 are made of aluminum. Alternatively, in other embodiment, the fin assembly 20 and the base 10 can be made of other materials having good heat dissipation capability. The fin assembly 20 includes a plurality of fins 21 parallel from each other. In this embodiment, the fins 21 are arranged along a lengthways direction of the base 10.

The heat absorber 30 is received in the receiving portion 131. The heat absorber 30 includes a main body 31 and two flanges 32 arranged two opposite ends of the main body 31. Specifically, the main body 31 and the receiving portion have the same configuration. A size/dimension of the main body 31 is slightly smaller than that of the receiving portion 131. The two flanges 32 symmetrically located at two opposite sides of the main body 31 near to the top surface 11 of the base 10 by resisting the inner surface of the recess 13. A surface of the each flange 32 away from the top surface 11 is coplanar with the bottom surface 12 of the base 10. The heat absorber 30 is made of materials having good heat dissipation capability different from the materials of the fin assembly. In this embodiment, the heat absorber 20 is made of copper.

The flexible sheet 40 is totally received in the recess 13. The flexible sheet 40 and the recess 13 have the same configuration. The flexible sheet 40 includes a limiting portion 41 and a plurality of flexible arms 42 obliquely extending outward from the limiting portion 41.

The limiting portion 41 is rectangular and annular. It is namely that the limiting portion 41 defines a limiting hole 411 for embedding the heat absorber 30. A size/dimension of the limiting hole 411 is equal to the size/dimension of the main body 31 of the heat absorber 30. The limiting portion 41 directly resists the inner surfaces of the receiving portion 131. The limiting portion 41 is coiled around the heat absorber 30 and located one side of the flanges 32 near to the base 10. The limiting portion 41 prevent the heat absorber 30 from moving/sliding a long a horizontal direction.

In this embodiment, there are four flexible arms 42. The four flexible arms 42 symmetrically extending outward from the four corners of the limiting portion 41. Each of the flexible arms 42 includes a extending section 421 connecting with the limiting portion 41, a connecting section 422 extending upward from the extending section 421, and a locking section 423 connected with the connecting section 422. The locking section 423 is a free end of the flexible arm 42. The extending section 421 horizontally extends outward from the limiting portion 41 and is received in the positioning portion 132 of the base 10. It is namely that the extending section 421 is coplanar with the limiting portion 41. The connecting section 422 obliquely extends upward from one end of the extending section 421 opposite to the limiting portion 41. The connecting section 422 is received in the positioning portion 132. The locking section 423 is parallel with the extending section 421. The locking section 423 is tightly arranged on the step 14. The locking section 423 is coplanar with the bottom surface 12 of the base 10. The locking section 423 defines a through hole 4231 corresponding to the through hole 141 of the step 14.

The fixing plate 50 is directly arranged on the bottom surface 12 of the base 10 by covering the recess 13. A size/dimension of the fixing plate 50 is slightly greater than the size/dimension of the recess 13. The heat absorber 30, the fixing plate 50 and the recess 13 of the base 10 cooperatively form a sealed/airtight cavity 501 for receiving the flexible sheet 40 and fixing the heat absorber 30. The fixing plate 50 is a rectangular and flat. The fixing plate 50 defines an opening 51 at a center thereof corresponding to the limiting portion 41 of the flexible sheet 40. A size/dimension of the opening 51 is equal to the size/dimension of the limiting portion 41. The fixing plate 50 directly resists one side surface of the flanges 32 away from the base 10. It is namely that the fixing plate 50 and the limiting portion 41 are respectively arranged at two opposite sides of the flanges 32 of the heat absorber 30 for positioning the heat absorber 30 at a longitudinal direction. The heat absorber 30 penetrates the fixing plate 50 via the opening 51. The fixing plate 50 further defines four through holes 52 corresponding to the through holes 141, 4231. The through holes 52, 4231, 141 have the same shape and size/dimension.

Figure 5:
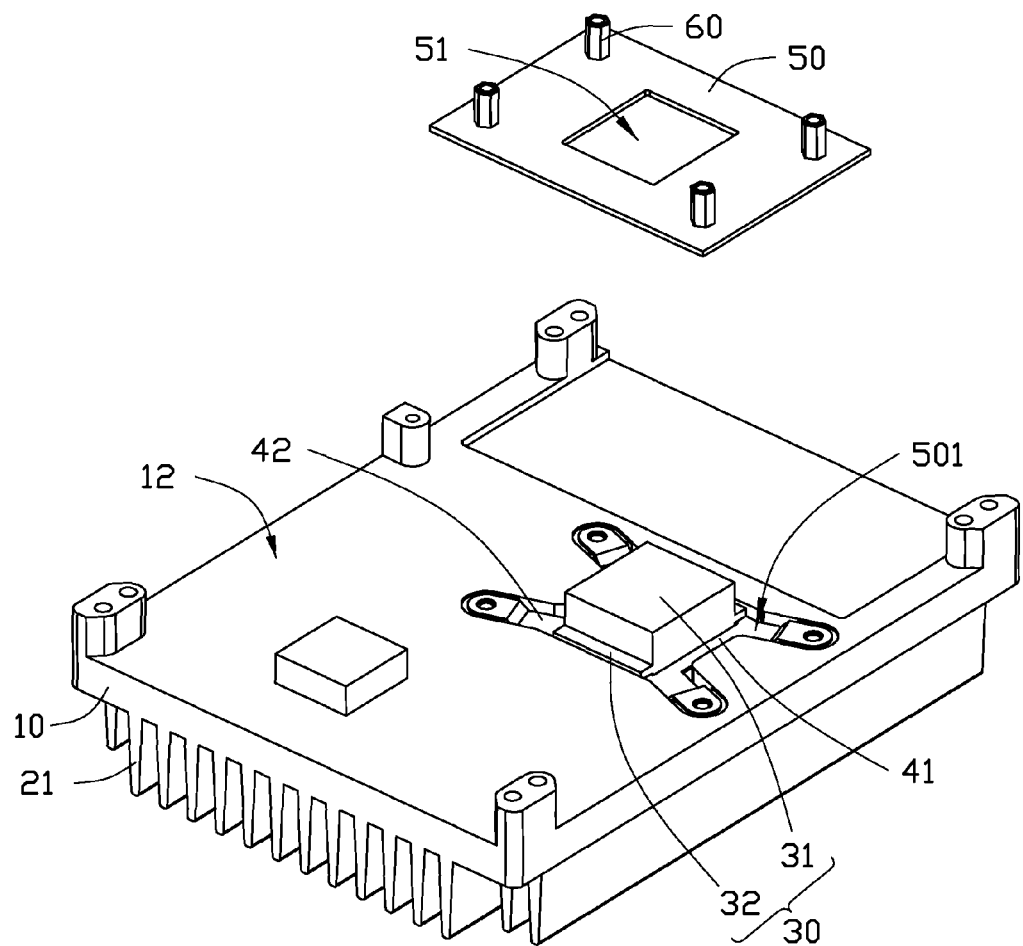
FIG. 5 is a preassembled view of the heat dissipation device of FIG. 1.

When the heat dissipation device 100 is assembled, referring to FIG. 5, the flexible sheet 40 is received in the recess 13 first, the limiting portion 41 of the flexible sheet 40 is arranged in the receiving portion 131 of the recess 13, and the flexible arms 32 are corresponding arranged in the positioning portions 132 of the recess 13. The locking section 423 of each of the flexible arms 42 is located at the corresponding step 14. The locking section 423 is coplanar with the bottom surface 12 of the base 10. The heat absorber 30 is embedded in the limiting hole 411 of the flexible sheet 40 and received in the receiving portion 131 of the recess 13. The side surface of the flanges 32 of the heat absorber 30 away from the heat assembly 12 is coplanar with the bottom surface 12 of the base 10. The fixing plate 50 is mounted to the bottom surface 12 of the base 10 by covering the recess 13. The fixing plate 50 directly contacts the locking section 423 of the flexible sheet 40 and the flanges 32 of the heat absorber 30. Finally, a plurality of fixing components 60 successively passes through the through holes 52, 4231, 141 to combine the fixing plate 50, the locking section 423 and the base 10. A top end of the heat absorber 30 is received in the sealed/airtight cavity 501 and a bottom end of the heat absorber 30 passes through the fixing plate 50 to expose out of the sealed/airtight cavity 501. In this embodiment, the fixing components 60 are screws.

When the heat dissipation device 100 is mounted to the circuit board (not shown), the flexible sheet 40 is elastically deformed to buffer a combination stress generated between the heat dissipation device 100 and the circuit board. Such that both the heat dissipation device 100 and the circuit board will not be deformed and are tightly connected together, and heats generated by electrical component can be evenly and quickly conducted to the heat absorber 30. Accordingly, the heat dissipating efficiency of the heat dissipating device 100 is increased. In addition, since the flexible sheet 40 is totally received in the sealed/airtight cavity 501, a whole thickness of the heat dissipation device 100 will not be increased, an external appearance of the heat dissipation device will not be influenced.

The embodiments shown and described above are only examples. Many details are often found in the art such as the other features of heat dissipation devices. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size and arrangement of the parts within the principles of the present disclosure up to, and including the full extent established by the broad general meaning of the terms used in the claims. It will therefore be appreciated that the embodiments described above may be modified within the scope of the claims.

What is claimed is:

1. A heat dissipation device comprising:
a base, the base having a top surface and a bottom surface, wherein a recess is defined in the bottom surface;
a fin assembly mounted on the top surface of the base; and
a heat absorber arranged at the bottom surface of the base and embedded in the recess, a fixing plate being positioned on the bottom surface to cover the recess and define a sealed and airtight cavity between the fixing plate and the base, a top end of the heat absorber being received in the sealed and airtight cavity and a bottom end of the heat absorber extending through the fixing plate to expose out of the sealed and airtight cavity, a flexible sheet being totally received in the sealed and airtight cavity to buffer a stress generated by assembling the heat dissipation device with external elements;

wherein the heat absorber comprises a main body and two flanges arranged at opposite sides of the main body, the flanges being received in the recess, a side surface of each flange away from the fin assembly being coplanar with the bottom surface of the base, the flanges directly resisting inner surface of the recess, the flanges, the flexible sheet and the fixing plate cooperatively positioning the heat absorber to the base.

2. The heat dissipation device of claim 1, wherein the recess comprises a receiving portion, the heat absorber being embedded in the receiving portion;

wherein the recess further comprises a plurality of positioning portions extending outward from the receiving portion, the base defining a step at each of the positioning portions, a thickness of each step is smaller than a depth of the recess;

wherein the flexible sheet and the recess have the same configuration, the flexible sheet comprising a limiting portion and a plurality of flexible arms extending outward from the limiting portion, the limiting portion surrounding the main body of the heat absorber and located at one side of each flange adjacent to the fin assembly;

wherein, the amount of the flexible arms is equal to that of the positioning portions, a free end of each flexible arm being positioned on the corresponding step and coplanar with the bottom surface of the base, the limiting portion and the fixing plate being arranged at two opposite sides of the flanges of the heat absorber;

wherein each of the flexible arms comprises an extending section connected with the limiting portion, a connecting section extending upward from the extending section, and a locking section connected with the connecting section, the extending section horizontally extending outward from the limiting portion and being received in the corresponding positioning portion, the locking section being the free end of the flexible arm, the locking section being parallel with the extending section.

3. The heat dissipation device of claim 2, wherein the limiting portion is rectangular and annular, there being four flexible arms, the four flexible arms symmetrically extending outward from the four corners of the limiting portion, the connecting section obliquely extending upward from the extending section.

4. The heat dissipation device of claim 2, wherein the extending section is coplanar with the limiting portion of the flexible sheet.

5. The heat dissipation device of claim 2, wherein the fixing plate defines an opening corresponding to the limiting portion, a size/dimension of the opening is same to that of the limiting portion, the main body of the heat absorber extending through the opening to expose the bottom end of the main body of the heat absorber, the fixing plate, the step and free ends of the flexible sheets correspondingly defines a plurality of through holes to combine the fixing plate, the base and the flexible sheet via fixing components.

6. The heat dissipation device of claim 1, wherein the base is a rectangular plate, each corner of the bottom surface of the base being provided with a block, the block defining a fixing hole extending through the block and the base.

7. The heat dissipation device of claim 1, wherein the heat absorber and the fin absorber are made of different materials, the heat absorber is made of copper.

8. The heat dissipation device of claim 1, wherein the base and the fin assembly are integrally formed as a single piece, the fin assembly and the base are made of aluminum.

* * * * *